United States Patent [19]

Peterson et al.

[11] 3,965,425
[45] June 22, 1976

[54] ELECTROMAGNETIC RADIATION SOURCE LOCATOR

[75] Inventors: Richard C. Peterson, North Adams; John D. Moynihan, Pittsfield; Martin W. O'Shea, Manchaug, all of Mass.

[73] Assignee: Sprague Electric Company, North Adams, Mass.

[22] Filed: Oct. 23, 1974

[21] Appl. No.: 517,266

[52] U.S. Cl. ............................. 325/364; 325/398; 343/113 PT
[51] Int. Cl.² .............................................. H04B 1/00
[58] Field of Search .......... 343/113, 112 D, 113 PT; 325/364, 398

[56] References Cited
UNITED STATES PATENTS

| | | | |
|---|---|---|---|
| 2,571,368 | 10/1951 | Kahn et al. | 343/112 D |
| 2,995,751 | 8/1961 | Bosch | 343/113 PT |
| 3,555,469 | 1/1971 | Harvey, Jr. | 331/111 |
| 3,820,018 | 6/1974 | Beasley et al. | 343/113 PT |

*Primary Examiner*—Maynard R. Wilbur
*Assistant Examiner*—Richard E. Berger
*Attorney, Agent, or Firm*—Connolly and Hutz

[57] ABSTRACT

A radiation locator apparatus includes a tuned or tunable radio receiver having an automatic gain control (AGC) circuit that provides a d.c. signal having an amplitude that is a function of the strength of the received radiation. A free running voltage controlled oscillator (VCO) is connected to earphones and produces a sound pitch that varies as a function of the magnitude of the d.c. (AGC) signal. An increase in the sound pitch may indicate an increase in the strength of the radiation received. When the locator is transported in a direction toward the source of radiation, the pitch increases thus guiding the operator to the source. The range of audible pitch may be extended by employing a pulse generator type of VCO since pulse repetition rates less than ten pulses per second are audible as spaced clicks that are equivalent to an extra low range of pitch.

5 Claims, 3 Drawing Figures

ELECTROMAGNETIC RADIATION SOURCE LOCATOR

BACKGROUND OF THE INVENTION

This invention relates to a method for locating a source of electromagnetic radiation. Such methods generally include connecting a directional antenna to a radio receiver, tuning the radio receiver to the frequency of electromagnetic radiation of interest, and rotating the antenna in a direction producing a maximum indication on the field strength meter in the receiver. At this point one may move in one of the two indicated directions and if the source is being approached, the field strength meter indication will rapidly increase. Whether the operator is walking and carrying the equipment or driving a vehicle toward the source, he must divide his attention between looking at the meter and controlling his course. Furthermore visual indicators such as meters have a practical limitation of resolution and range that in this field intensity measurement application usually requires the operator to periodically switch to a higher range and thus further diverting his attention. This procedure is so clumsy, in practice, that it is more usual to determine the direction of the source of radiation from two spaced positions and triangulate to determine the position of the source. The latter steps are of course quite involved also.

It is therefore an object of this invention to provide a simplified method for locating a source of electromagnetic radiation.

It is a further object of this invention to provide a portable apparatus for locating the source of radiation that produces a non-visual indication of received signal strength to permit an operator's visual attention to be fully directed to the steering of his course.

It is yet a further object of this invention to provide a portable and readily camouflaged apparatus for locating a clandestine source of radiation.

SUMMARY OF THE INVENTION

A radio receiver apparatus for determining the location of a source of electromagnetic radiation normally includes a circuit that provides a d.c. signal to an ammeter which signal is a function of the strength of the received radiation. The meter is called a field strength meter. This d.c. signal typically is or is derived from an automatic gain control signal provided by the receiver. According to the principles of this invention, a voltage controlled oscillator (VCO) is connected to the receiver so as to produce an audio signal having a frequency that is a function of the magnitude of the d.c. signal.

When an electro-acoustic transducer is connected to the output of the VCO, a sound is produced having a pitch that is a function of the strength of the received radiation. The VCO may be of the pulse generator type thereby effectively extending the range of audible pitch at the low end of the audio spectrum. This apparatus is moved in a direction that causes the audible signal to change in pitch corresponding to an increasing strength of the electromagnetic radiation.

The exceptional ability of the human ear to finely resolve a broad spectrum of audible frequencies makes it possible and practical by use of the apparatus of this invention to be unhesitatingly directed toward a radiation source while the field strength changes many orders of magnitude, and without requiring a manual change in the sensitivity of the equipment. Thus the hands and eyes are relatively free and the source is quickly and simply tracked down.

DESCRIPTION OF THE PREFERRED EMBODIMENT

Figure 1:
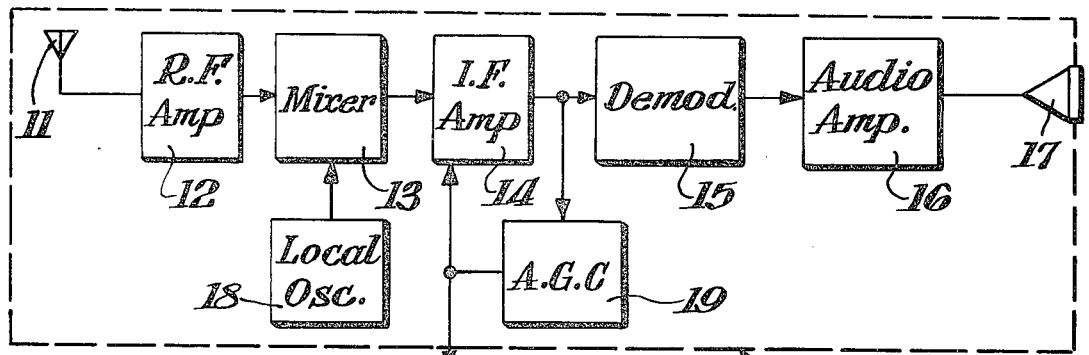
In FIG. 1 is shown a block diagram of an apparatus of this invention for locating a source of radiation, a dashed line encompassing a conventional portion of the apparatus.

The electromagnetic radiation location apparatus shown diagramatically in FIG. 1 includes a standard radio receiver 10. An antenna 11 is connected to the input of the radio frequency (R.F.) amplifier 12 in standard fashion. The radio receiver 10 is a conventional heterodyne type having an R.F. amplifier tuned to the frequency of electromagnetic radiation of interest. The amplified R.F. signal is beat with the local oscillator signal, derived from a local oscillator 18, in the mixer circuit 13. The beat frequency or intermediate frequency (I.F.) is fed to an I.F. amplifier 14. The amplifier I.F. signal is fed to a demodulator 15, that is an amplitude modulation detector. The demodulator 15 may alternatively be a frequency modulation detector. The demodulated signal is then amplified in audio amplifier 16 and fed to an electro-acoustic transducer such as speaker 17, as shown, headphones or the like.

The radio receiver 10 is also equipped with an automatic gain control (AGC) circuit 19. This AGC circuit produces a d.c. signal, that is a function of the strength of the I.F. signal, and this d.c. signal (AGC signal) is fed back to the I.F. amplifier so as to reduce the gain of I.F. amplifier 14 in response to an increase in the magnitude of the I.F. signal. The AGC signal may also be fed back in a similar manner to the R.F. amplifier 12 (not shown).

The AGC signal is shown further connected to a "voltage controlled oscillator" (VCO) 20, the output oscillator frequency being a function of the applied d.c. signal. In this radiation locator apparatus, the range of oscillation frequencies over which the VCO is controllable includes the audio range as will be more particularly defined below. The term VCO is well known in the art and as used herein is meant to include oscillators having a wide variety of a.c. output wave forms, and is further meant to include voltage or current controlled oscillators.

The VCO in FIG. 1 is shown connected to a speaker type of electro-acoustic transducer 21. In the electromagnetic radiation detector of FIG. 1, the AGC signal amplitude is an inverse function of the magnitude of electromagnetic radiation received. Also, the frequency of the VCO preferably decreases as the amplitude of the controlling AGC signal applied increases. Thus when the received signal strength increases, the pitch of the sound from speaker 21 increases.

In operation this electromagnetic radiation locator is used to locate a source of radiation as follows. The R.F. amplifier and local oscillator are tuned to receive the frequency of the radiation of interest. The locator with antenna is moved in a direction to cause the pitch of the sound from speaker 21 to increase. By moving continuously in the direction for increased pitch, the source itself is finally encountered. Of course, the locator apparatus is most conveniently made portable by incorporating its own power supply as for example, batteries.

For most radiation location work, it is preferred to employ a directional antenna as this causes the user to take a more direct path to the source. However, it will be appreciated that an omnidirectional antenna will provide satisfactory operation and may be especially useful for initially detecting and determining the direction of the source of radiation.

Figure 2:
In FIG. 2 is shown a circuit diagram of the IF amplifier and AGC circuit of the apparatus of FIG. 1.
Figure 2:
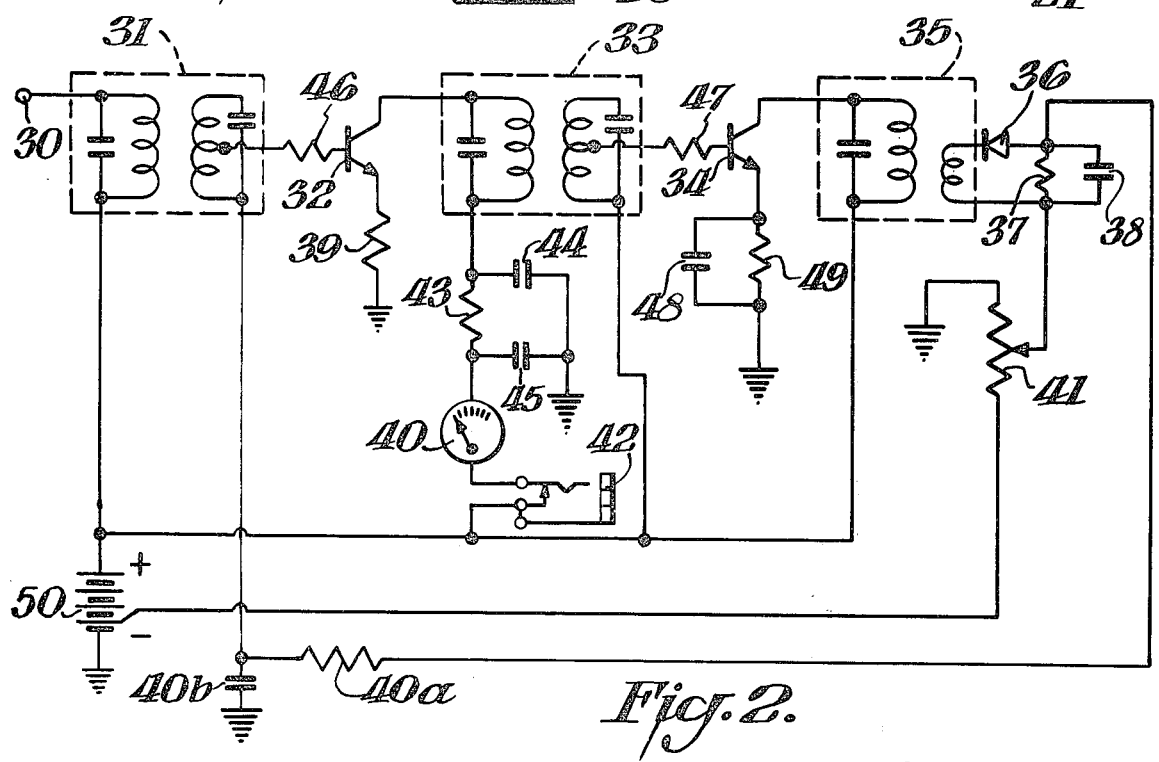

In FIG. 2 there is shown a circuit diagram of the I.F. amplifier and AGC circuit portions of a radiation detector. A first I.F. tuned transformer 31 has connected to the primary side a terminal 30 that is to be fed from the output of the mixer 13 of FIG. 1. The output from the secondary of transformer 31 is connected to the base of transistor 32 whose collector in turn connects to the primary side of a second tuned I.F. transformer 33. The output from the secondary of the transformer 33 connects to the base of transistor 34 whose collector is connected to the primary side of a third I.F. transformer 35. Thus, transistors 32 and 34 serve as the amplifiers in the two I.F. stages, respectively.

Transistor 32 also serves the additional function of d.c. amplification as will be more fully explained.

The output from the secondary of I.F. transformer 35 is rectified by diode 36 and filtered by resistor 37 and capacitor 38. The anode of diode 36 is connected through a low pass filter, made up of resistor 40a and capacitor 40b, subsequently through the secondary of transformer 31 to the base of transistor 32. When the magnitude of the I.F. signal from the mixer at terminal 30 increases, the magnitude of the amplified I.F. signal at the secondary of transformer 35 tends to increase causing in turn the magnitude of the d.c. (AGC) signal voltage across resistor 37 to increase. The now more negative voltage across resistor 37 is impressed on the base of transistor 32 and the collector current through transistor 32 is diminished accordingly. This has the dual effect of reducing the I.F. gain of the first I.F. stage and at the same time changes (reduces) the indicated current as read on the R.F. field strength meter 40 through which that collector current flows. This metered collector current is thus an AGC signal current which is inversely related to the magnitude of the radiation being received.

The network comprised of resistor 43 and capacitors 44 and 45 serves to filter high frequency signals from the d.c. current that flows through the meter 40 and the jack 42. Resistor 49 and capacitor 48 serve as a normal filtered self bias network for transistor 34. Resistors 46 and 47 serve as current limiting resistors at the bases of transistors 32 and 34, respectively.

It will be noted that transistor 32 has a resistor 39 connected between the emitter and ground so that from the base of transistor 32 to ground there is effectively provided a high impedance due to the negative feedback at the emitter. The filter comprised of the aforementioned resistor 40a and capacitor 40b in combination with the high input impedance of the transistor 32 forms a so-called quasipeak filter having time constants to provide a relatively rapid rise and a slow decay of the voltage appearing at the base of transistor 32 in response to an impulse of voltage appearing across resistor 37. Typical rise and decay time constants are 35 and 700 milliseconds, respectively. Such impulses will occur repetitively, for example, when the radiation being detected comes from an a.c. corona discharge source. The resulting signal appearing at the base of transistor 32 will be essentially smooth and constant having a magnitude that is a function of the strength of the radiation being received. The AGC voltage at resistor 37 is effectively in series with the adjustable and oppositely polarized voltage appearing at the voltage dividing potentiometer 41. This potentiometer is normally adjusted for full scale deflection of the meter 40 with no received signal.

Figure 3:
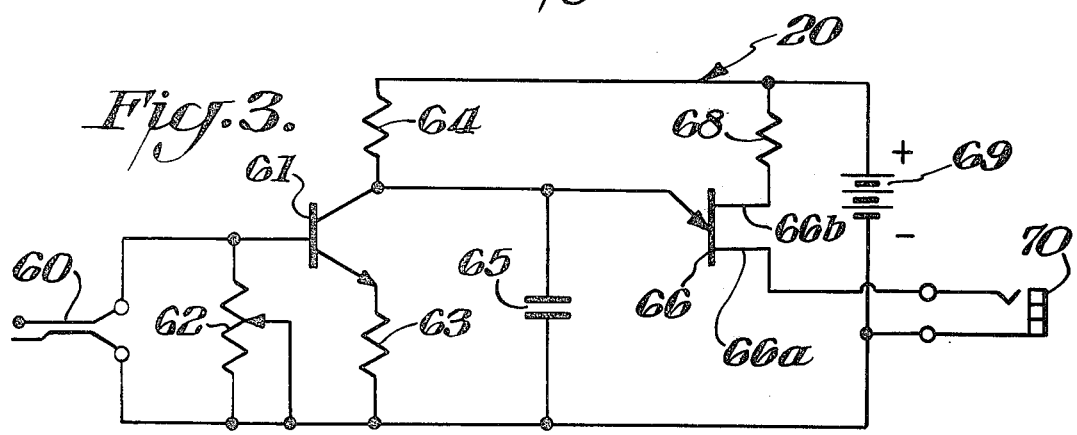
In FIG. 3 is shown a circuit diagram of the voltage controlled oscillator (VCO) of the apparatus of FIG. 1.

A voltage controlled oscillator 20 is shown in schematic form in FIG. 3, that is designed for use in conjunction with the circuit of FIG. 2. A free running pulse generator is formed by the unijunction transistor 66, resistors 64 and 68, and capacitor 65. In operation, the phone plug 60 is plugged into the phone jack 42 of FIG. 2, and a plug connected to earphones or other electro-acoustic transducer may be connected at phone jack 70. A small current flows continuously through the earphones, through the transistor from base 66a to base 66b and through the current limiting resistor 68. At an instant when the capacitor 65 has no charge, the junction of transistor 66 is reverse biased and nonconducting. As capacitor 65 charges through resistor 64, the emitter of transistor 66 rises toward the supply voltage that is provided by battery 69. When the emitter reaches the peak point voltage of the unijunction transistor 66; the emitter becomes forward biased, the resistance between the emitter and base 66a drops to a low value and the capacitor 65 discharges through transistor 66 and the low impedance earphones. The cycle then repeats. Each cycle produces a click sound in the earphones.

Transistor 61 forms a voltage divider with its collector resistor 64 and emitter resistor 63 across the battery supply. When the conductivity of transistor 61 from emitter to collector increases, the voltage toward which capacitor 65 charges is reduced and the unijunction oscillator frequency is reduced. The conductivity of transistor 61 is controlled by the current that flows from phone jack 42 and that divides between base resistor 62 and the base to emitter junction of transistor 61. The effective value of resistor potentiometer 62 is adjustable for altering the sensitivity of the oscillator frequency to the d.c. current supplied through jack 42.

By adjusting potentiometer 41 in FIG. 2, with no radiation signal being received, the AGC current flowing through transistor 32 can be established that will produce a frequency of oscillations or pulse repetition rate of the VCO 20 that is a low predetermined value. This low reference frequency should of course be audible and if the VCO produces a pure sinusoidal wave form, the low reference frequency should not be below about 20 Hz for most uses.

However, when a pulse generator type VCO such as that exemplified in FIG. 3 is employed, the low reference repetition rate may be set much lower, about 1 Hz being preferred. Reference rates from 0.5 Hz to 10Hz will be satisfactory. The audible range of frequencies/-repetition-rates for pulse generators is greater than that for sinewave oscillators since each pulse is made up of a wide range of sinusoidal frequencies and thus pulse repetition rates much lower than 20 Hz produce in an electric acoustic transducer audible sounds whose apparent "pitch" is still a function of the repetition rate.

Furthermore, human pitch discrimination is relatively high compared to human sound or meter-deflection amplitude discrimination and the use of sound pitch according to the principles of this invention in a radiation detector and locator provides a particularly broad range of detectable and resolvable received radiation amplitudes compared to that of previous methods used.

A further advantage is realized in the use of the radiation locator of this invention since the operator carrying the portable apparatus can simultaneously navigate visually while being guided aurally by the changing pitch of the sound. For determining the location of clandestine sources of radiation, the locator apparatus may be discreetly housed and carried by a plain clothes law officer in a brief case while he listens to and is guided by the variable pitch sound from small or otherwise concealed headphones.

The audio channel comprised of the demodulator 15, the audio amplifier 16 and the speaker 17 as shown in FIG. 1 is not essential to the main locator function of the radiation detection apparatus. However, it is often convenient, especially initially in picking up a signal, to be able to identify or to "fingerprint" the source of radiation by listening to its characteristic demodulated sound. In FIG. 2, a second secondary winding may be added to transformer 35, and the signal therefrom rectified to provide an amplitude modulation audio signal for this purpose.

A radiation locator apparatus has been built that includes the circuits as shown in FIGS. 2 and 3. The circuit in FIG. 2 is shown in simplified form for clarity, and several conventional high frequency filter components have been omitted. The component values for these circuits as shown are presented below.

| | |
|---|---|
| 31, 33 and 35 | 455 KHz I.F. Transformers |
| 32, 34 | RCA No. 40481 |
| 61 | 2N3392 |
| 66 | 2N2646 |
| 36 | IN542 |
| 37 | 3.3K ohms |
| 39 | 39 ohms |
| 40a | 18K ohms |
| 41 | 5K ohms |
| 43 | 100 ohms |
| 46 | 220 ohms |
| 47 | 22 ohms |

-continued

| | |
|---|---|
| 49 | 470 ohms |
| 62 | 5K ohms |
| 63 | 2.4K ohms |
| 64 | 2.4K ohms |
| 68 | 560 ohms |
| 38 | 0.02 mfd |
| 40b | 2.0 mfd |
| 44 | 0.03 mfd |
| 45 | 0.01 mfd |
| 48 | 0.04 mfd |
| 65 | 10.0 mfd |
| 40 | 2 ma. meter |
| 50 | 12 volt battery with 1.5 volt tap |
| 69 | 9 volt battery |

We claim:

1. In an apparatus for locating the source of electromagnetic radiation of the type including a radio receiver that provides a d.c. signal whose amplitude is a function of the strength of the received radiation, the improvement comprising:

a voltage controlled audio oscillator (VCO) of the pulse generator type being connected to and controlled by said d.c. signal, said VCO having a pulse repetition rate of from 0.5 to 10 pulses per second when said strength of said received radiation is zero and said repetition rate increasing as a function of said received radiation strength, the output of said VCO being adapted for connection to an electroacoustic transducer, for the purpose of producing a sound whose pitch increases with said received radiation strength.

2. In the apparatus as cited in claim 1, said signal amplitude function of said strength of said received radiation being an inverse relationship, and said VCO producing lower frequencies of oscillation as said d.c. signal amplitude increases.

3. In the apparatus of claim 1, said signal amplitude function of said strength of said received radiation being a positive relationship, and said VCO producing higher frequencies of oscillation as said d.c. signal amplitude increases.

4. In the apparatus as recited in claim 1, said d.c. signal being derived from an automatic gain control (AGC) circuit.

5. In the apparatus as recited in claim 4, said AGC circuit including a quasipeak type detector.

* * * * *